(12) United States Patent
Park et al.

(10) Patent No.: US 12,248,015 B2
(45) Date of Patent: Mar. 11, 2025

(54) INTEGRATED CIRCUIT HAVING CURRENT DETECTION DEVICE AND OPERATING METHOD THEREOF

(71) Applicant: Samsung Electronics Co., Ltd., Suwon-si (KR)

(72) Inventors: Junsik Park, Suwon-si (KR); Heesu Kim, Suwon-si (KR); Kyungsuk Kim, Suwon-si (KR); Namsu Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 237 days.

(21) Appl. No.: 18/154,958

(22) Filed: Jan. 16, 2023

(65) Prior Publication Data

US 2023/0400502 A1 Dec. 14, 2023

(30) Foreign Application Priority Data

Jun. 9, 2022 (KR) .......................... 10-2022-0069946

(51) Int. Cl.
*H02H 9/04* (2006.01)
*G01R 31/16* (2006.01)

(52) U.S. Cl.
CPC .................................. *G01R 31/16* (2013.01)

(58) Field of Classification Search
CPC ..................................................... G01R 31/16
See application file for complete search history.

(56) References Cited

U.S. PATENT DOCUMENTS

| | | | |
|---|---|---|---|
| 7,675,723 B2 | 3/2010 | Ker et al. | |
| 8,400,743 B2 | 3/2013 | Kosonocky et al. | |
| 8,536,893 B2 | 9/2013 | Henderson et al. | |
| 9,001,478 B2 | 4/2015 | Ker et al. | |
| 9,397,087 B1 | 7/2016 | Kull et al. | |
| 9,673,116 B2 | 6/2017 | Deforge et al. | |
| 10,944,602 B1* | 3/2021 | Rogers | H04L 25/03146 |
| 11,133,232 B2 | 9/2021 | Jang et al. | |
| 2011/0113401 A1* | 5/2011 | Kireev | G06F 30/367 |
| | | | 716/136 |
| 2014/0184253 A1 | 7/2014 | Nelsen et al. | |
| 2015/0280415 A1 | 10/2015 | Welty | |

(Continued)

FOREIGN PATENT DOCUMENTS

KR 1020230064052 A 5/2023

*Primary Examiner* — Alesa Allgood
(74) *Attorney, Agent, or Firm* — Myers Bigel, P.A.

(57) ABSTRACT

An IC includes a pad, a current detection device connected to the pad and configured to generate monitoring information corresponding to an electrostatic discharge (ESD) event, and an internal circuit configured to receive the monitoring information from the current detection device, wherein the current detection device includes a current sensing circuit having a T-coil that is configured to generate an ESD current when the ESD event occurs and is further configured to generate an induced voltage corresponding to the ESD current, a plurality of detection circuits outputting a detection signal based on the induced voltage, and a monitoring circuit configured to receive the detection signal from each of the plurality of detection circuits and configured to generate the monitoring information, wherein the plurality of detection circuits have different sensitivities with respect to the induced voltage.

20 Claims, 16 Drawing Sheets

(56) References Cited

U.S. PATENT DOCUMENTS

2017/0346280 A1 11/2017 Stockinger et al.
2019/0123551 A1 4/2019 Yuan et al.
2023/0133288 A1 5/2023 Park et al.

* cited by examiner

INTEGRATED CIRCUIT HAVING CURRENT DETECTION DEVICE AND OPERATING METHOD THEREOF

CROSS-REFERENCE TO RELATED APPLICATION(S)

This application claims benefit of priority to Korean Patent Application No. 10-2022-0069946 filed on Jun. 9, 2022 in the Korean Intellectual Property Office, the disclosure of which is incorporated herein by reference in its entirety.

BACKGROUND

The present inventive concept relates generally to management of electrostatic discharge (ESD) events and, more particularly, to an integrated circuit having a current detection device and an operating method thereof.

In general, ESD is a physical phenomenon related to triboelectricity. In the entire electronic product production/distribution process from integrated circuit (IC) production, package (PKG) assembly, and printed circuit board (PCB) assembly, to finished product assembly, various transient events, such as charged device model (CDM), charged board event (CBE), human metal model (HMM), human body model (HBM), burst, surge, and the like, may occur in devices to damage ICs.

In general, in a production line, only the surrounding environment is managed to inhibit or prevent ESD from occurring, and information on the level of ESD occurring in an IC is not known. Since the ESD level actually experienced by the IC is not monitored, it may be difficult to actively manage ESD before an ESD failure occurs.

SUMMARY

An aspect of the present inventive concept is to provide an integrated circuit that may be used for management of ESD events and an operating method thereof.

According to an aspect of the present inventive concept, an integrated circuit includes a pad, a current detection device connected to the pad and configured to generate monitoring information corresponding to an electrostatic discharge (ESD) event, and an internal circuit configured to receive the monitoring information from the current detection device, wherein the current detection device includes: a current sensing circuit having a T-coil that is configured to generate an ESD current when the ESD event occurs and is further configured to generate an induced voltage corresponding to the ESD current, a plurality of detection circuits outputting a detection signal based on the induced voltage, and a monitoring circuit configured to receive the detection signal from each of the plurality of detection circuits and configured to generate the monitoring information, wherein the plurality of detection circuits have different sensitivities with respect to the induced voltage.

According to another aspect of the present inventive concept, an operating method of an integrated circuit includes generating an electrostatic discharge (ESD) current in a T-coil, applying induced electromotive force based on the ESD current to each of a plurality of detection circuits connected to the T-coil in parallel, causing a change in a characteristic of a detection transistor of each of the plurality of detection circuits responsive to the induced electromotive force, and storing ESD event information and ESD current characteristic information corresponding to the change in the characteristic of the detection transistor.

According to another aspect of the present inventive concept, an integrated circuit includes an internal circuit and at least one current detection device connected to the internal circuit, which is configured to generate an electrostatic discharge (ESD) current using a T-coil when an ESD event occurs, and is configured to detect an ESD level based on the ESD current using a plurality of detection circuits, and is further configured to generate ESD monitoring information based on the ESD level, wherein the internal circuit includes at least one ESD protection circuit configured to protect the internal circuit from the ESD event and an ESD detection register configured to store the ESD monitoring information.

According to another aspect of the present inventive concept, an integrated circuit includes a current sensing circuit configured to generate an electrostatic discharge (ESD) current using a T-coil when an ESD event occurs, a plurality of detection circuits connected to the T-coil and configured to receive an induced voltage corresponding to the ESD current, and a monitoring circuit configured to monitor a change in a characteristic of each of the plurality of detection circuits.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
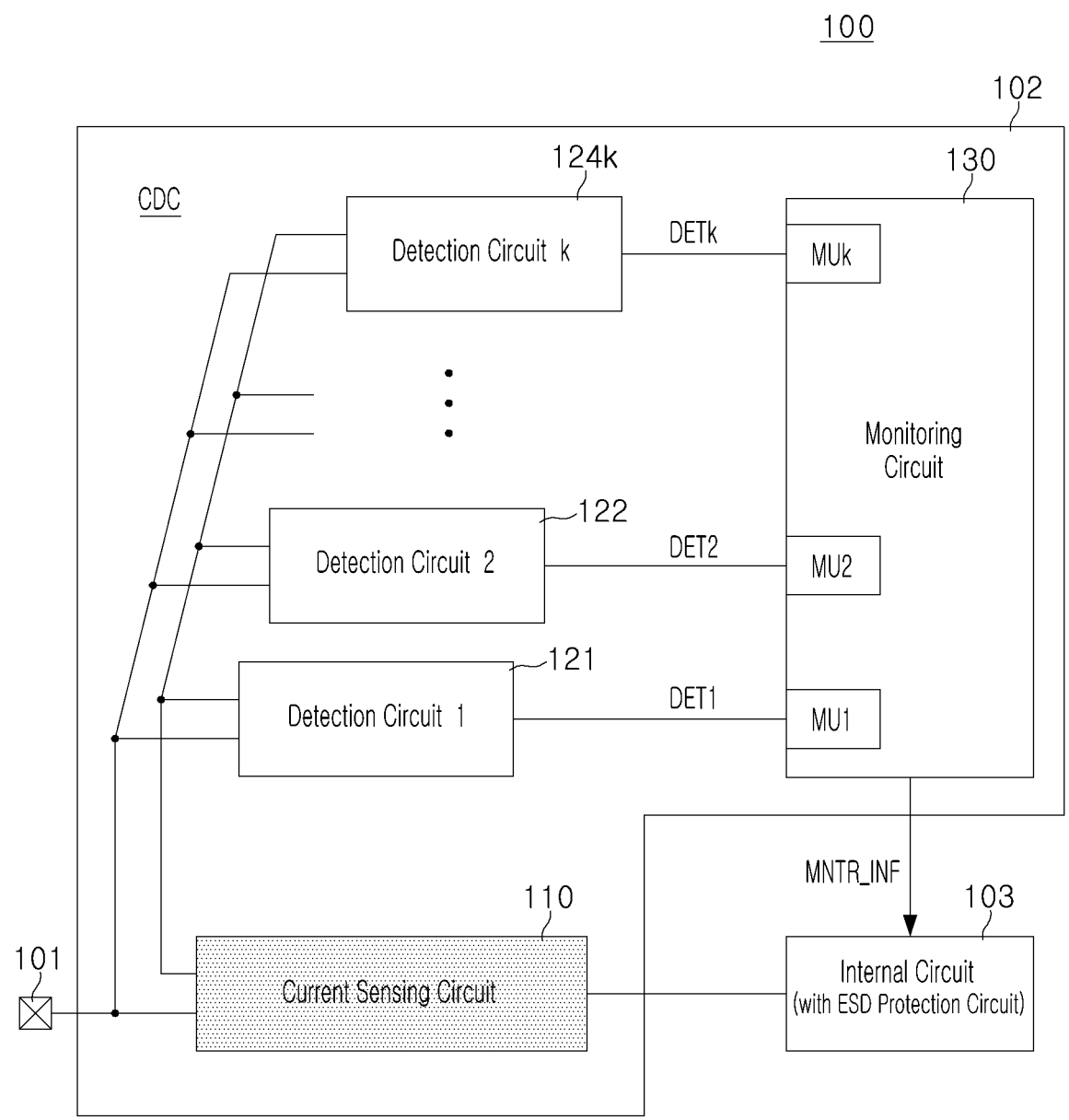
FIG. 1 is a diagram illustrating an integrated circuit according to an embodiment of the present inventive concept.

Hereinafter, example embodiments of the present inventive concept will be described with reference to the accompanying drawings. The present inventive subject matter may, however, be embodied in many different forms and should not be construed as limited to the embodiments set forth herein. In the drawings, like numerals refer to like elements throughout the description and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

An integrated circuit (IC) and an operating method thereof according to an embodiment of the present inventive concept may actively manage electrostatic discharge (ESD) in a manufacturing stage by monitoring a polarity or ESD level of ESD events. An IC according to an embodiment of the present inventive concept may include a current detection device for detecting the polarity and level range of the ESD without degradation of signal integrity (SI). For example, the current detection device may include a current sensing circuit configured to sense an ESD current using a T-coil, detection circuits configured to detect a polarity and a difference in sensitivity of a level filtering element according to ESD current, and a monitoring circuit configured to monitor a characteristic of a detection transistor of each of the detection circuits. The IC according to an embodiment of the present inventive concept improves ESD current sensing sensitivity and may efficiently use silicon area by using a T-coil. Accordingly, it may be possible to effectively respond to the range of ESD current and ESD polarity caused in a manufacturing line of the IC.

FIG. 1 is a diagram illustrating an IC 100 according to an embodiment of the present inventive concept. Referring to FIG. 1, the IC 100 may include a pad 101, a current detection device (CDC) 102, and an internal circuit 103.

The pad 101 may be implemented to receive input/output (I/O) data or a power supply/ground voltage.

The current detection device 102 may be connected to the pad 101 and may be implemented to detect an ESD current flowing through the pad 101.

The current detection device 102 may include a current sensing circuit 110, a plurality of detection circuits 121, 122, . . . , 12k, where k is an integer greater than or equal to 2), and a monitoring circuit 130.

The current sensing circuit 110 may be implemented to sense a current corresponding to an ESD event. For example, the current sensing circuit 110 may be configured to sense the ESD current using the T-coil and to output induced electromotive force (or an induced voltage) corresponding to the sensed current.

Each of the plurality of detection circuits 121, 122, . . . , 12k may be implemented to receive an electromotive force based on the ESD current and to change characteristics of a detection transistor according to the received electromotive force. In an embodiment, each of the plurality of detection circuits 121, 122, . . . , 12k may have a detection transistor with different characteristics. That is, each of the plurality of detection circuits 121, 122, . . . , 12k may be implemented to have different sensitivities according to the received electromotive force. In an embodiment, each of the plurality of detection circuits 121, 122, . . . , 12k may be configured to generate detection signals DET1, DET2, . . . , DETk corresponding to the received electromotive force.

The monitoring circuit 130 may be implemented to receive the detection signals DET1, DET2, . . . , DETk from the plurality of detection circuits 121, 122, . . . , 12k. For example, the monitoring circuit 130 may receive the detection signals DET1, DET2, DETk indicating the presence or absence and degree of a change in characteristics of each detection transistor of respective ones of the plurality of detection circuits 121, 122, . . . , 12k. In addition, the monitoring circuit 130 may include a plurality of monitoring units (MUs) 131, 132, . . . , 133k. The plurality of monitoring units 131, 132, . . . , 133k may be implemented to receive the corresponding detection signals DET1, DET2, . . . , DETk, respectively. Also, the monitoring circuit 130 may be configured to transmit monitoring information MNTR_INF corresponding to the received detection signals DET1, DET2, . . . , DETk to the internal circuit 103.

The current detection device 102 may be configured to generate an ESD current when an ESD event occurs, to generate a corresponding induced voltage, to generate a change in a characteristic of the detection transistors having different sensitivities based on the induced voltage, to generate the detection signals DET1, DET2, . . . , DETk based on the change in the characteristics of the detection transistors, and to generate the monitoring information MNTR_INF based on the detection signals DET1, DET2, . . . , DETk.

The internal circuit 103 may be implemented to perform an internal operation of the IC 100. In addition, the internal circuit 103 may include an ESD protection circuit to provide protection from the ESD current generated by the current detection device 102. In an embodiment, the ESD protection circuit may be implemented as a diode, a resistor, a transistor, and/or a silicon controlled rectifier (SCR). In an embodiment, the ESD protection circuit may be implemented in a fin field effect transistors (FinFETs) structure.

Also, the internal circuit 103 may be implemented to store the monitoring information MNTR_INF from the current detection device 102 and to output the stored monitoring information MNTR_INF according to an external request.

The IC 100 according to an embodiment of the present inventive concept includes the current detection device 102 configured to determine a polarity of ESD or a level of ESD by sensing the ESD current through the T-coil when a temporary event (CDM, CBE, HMM, HBM, burst, surge, etc.) occurs, thereby managing ESD without degradation of signal integrity (SI) performance of high-speed I/O.

In addition, the IC 100 according to an embodiment of the present inventive concept may be configured to provide high space efficiency by using the T-coil.

In addition, the IC 100 according to an embodiment of the present inventive concept may be configured to obtain a double effect of the induced voltage compared to the related art by using the T-coil.

Figure 2:
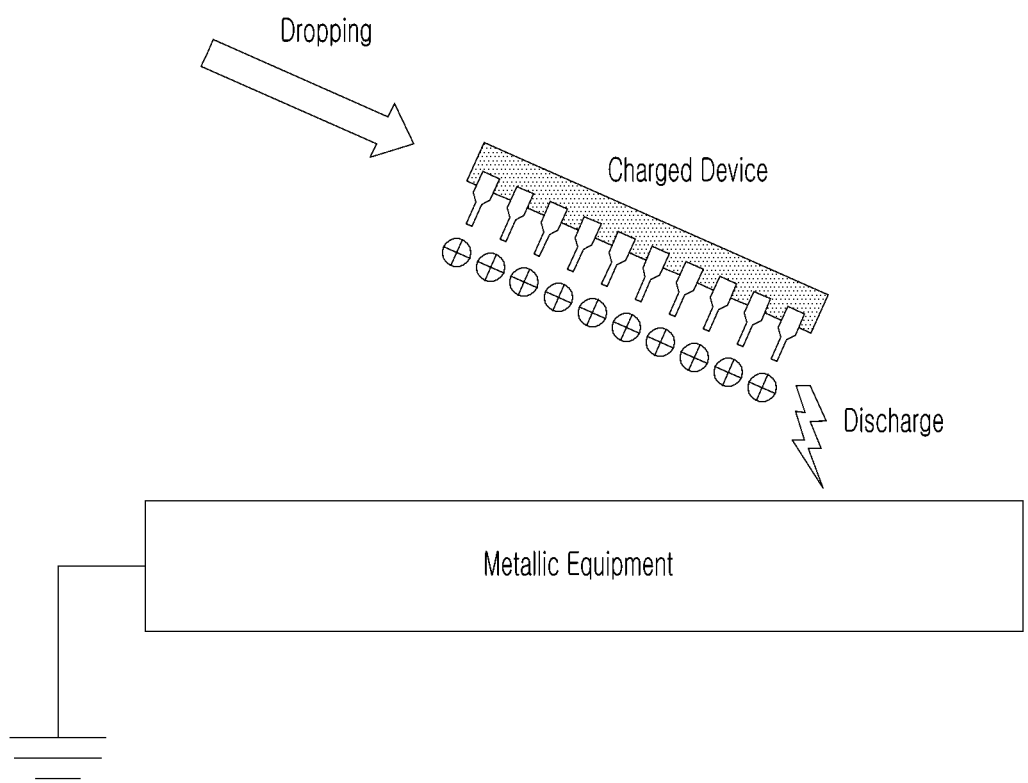
FIG. 2 is a diagram illustrating an electrostatic discharge (ESD) event.

FIG. 2 is a diagram illustrating an ESD event. Referring to FIG. 2, a charged IC may be dropped on a metal device and may be discharged. Accordingly, the IC may experience an ESD event based on a charged device model (CDM).

Meanwhile, ESD events may not be limited to CDM events. In general, ESD is one of the main causes of defects in semiconductor products, and is a phenomenon in which electric charges move instantaneously when two objects having different potentials come into contact. The human body gains or loses electric charge in various ways, and has a positive or negative state through triboelectricity. Several situations in which semiconductor devices experience actual ESD phenomena are modeled, and the ESD sensitivity of the product is classified into several classes according to each test level.

The human body model (HBM) assumes that two objects that have lost or gained charges in various ways are a semiconductor and a human body. A circuit that simulates human body characteristics is configured and ESD pulses are applied to the semiconductor. HBM classification levels are 250 V to 8000 V. The machine model (MM) simulates an ESD phenomenon that occurs when an IC makes contact with other object, in a state in which the IC has been charged with electric charges while rubbing against equipment or other metals, for example, during a semiconductor manufacturing process. An MM classification level is 50V to 400V. The charged device model (CDM) is a model most closely related to field failure. A method of charging an IC with electric charges in a package and then discharging the electric charges is used. A CDM classification level is 200V to 1000V.

Figure 3:
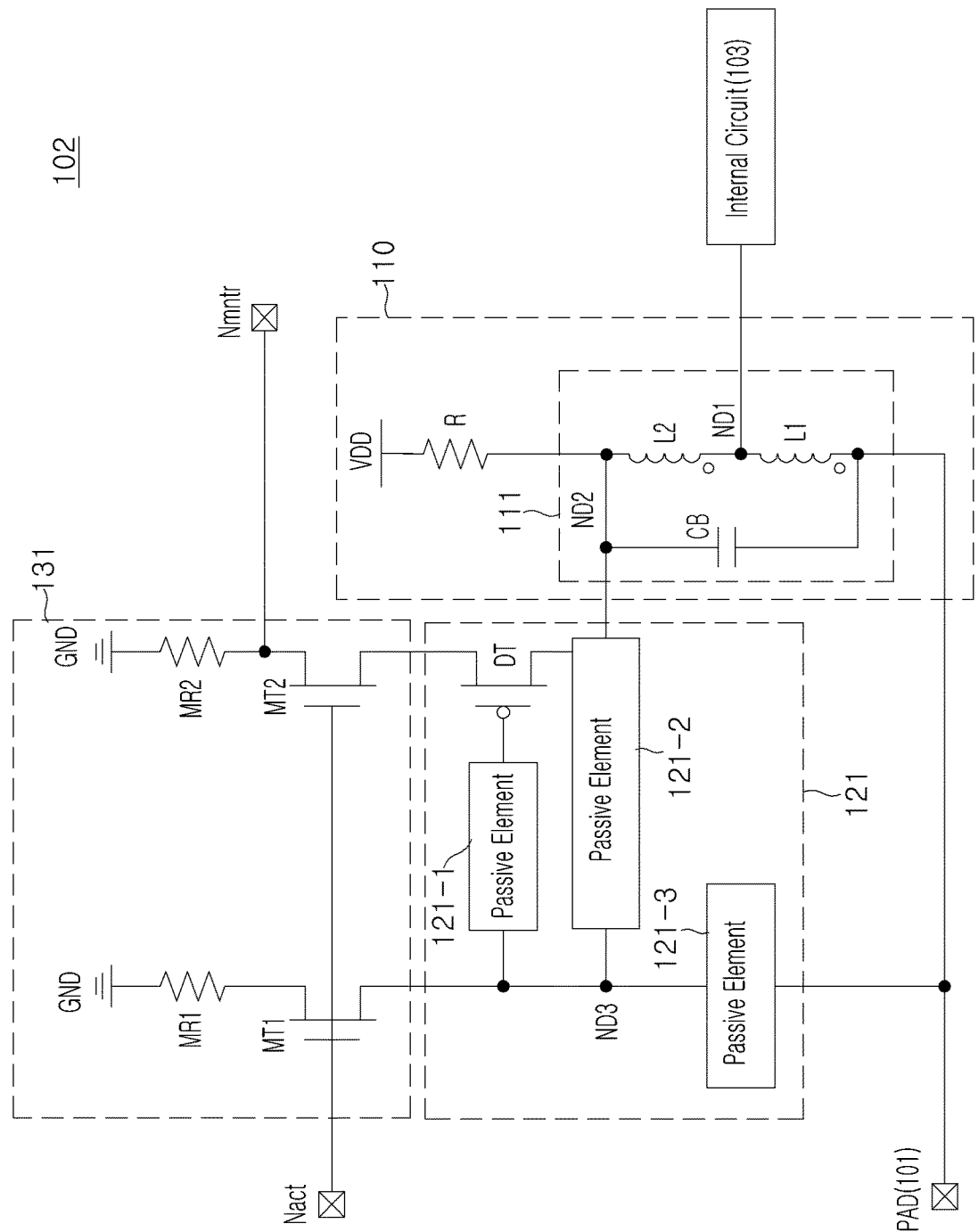
FIG. 3 is a diagram illustrating a current detection device according to an embodiment of the present inventive concept.

FIG. 3 is a diagram illustrating the current detection device 102 according to an embodiment of the present inventive concept. Referring to FIG. 3, the current detection device 102 may include the current sensing circuit 110, the detection circuit 121, and a monitoring unit 131.

The current sensing circuit 110 may be implemented to detect an ESD current using the T-coil 111. The T-coil 111 may include a first reactor L1 connected between the pad 101 and a first node ND1, a second reactor L2 connected between the first node ND1 and a second node ND2, and a parasitic capacitor CB connected to both ends of the T-coil 111. Here, the first node ND1 may be connected to the internal circuit 103. Also, the current sensing circuit 110 may further include a resistor connected between the power supply terminal VDD and the second node ND2.

The detection circuit 121 may include a plurality of passive elements 121-1, 121-2, and 121-3 and a detection transistor DT.

Each of the plurality of passive elements 121-1, 121-2, and 121-3 may be implemented as a resistor, a reactor, a capacitor, and/or a diode.

The first passive element 121-1 may be connected between a gate of the detection transistor DT and a third node ND3. The second passive element 121-2 may be connected between the second node ND2, the third node ND3, and a source of the detection transistor DT. The third passive element 121-3 may be connected between the pad 101 and the third node ND3. Although the number of passive elements illustrated in FIG. 3 is three, embodiments of the present inventive concept are not limited thereto. In addition, it should be understood that the connection relationship of each of the passive elements is not limited to that shown FIG. 3.

The detection transistor DT may be connected between the monitoring circuit 130 and the second node ND2. The detection transistor DT may be turned on/off based on values of the passive elements 121-1, 121-2, and 121-3 thereby indicating characteristics corresponding to the ESD current. That is, the detection transistor DT may output a detection signal DET1 (refer to FIG. 1) corresponding to the ESD current based on the values of the passive elements 121-1, 121-2, and 121-3. In an embodiment, the detection transistor DT may be implemented as a power transistor, a bipolar transistor, or a metal oxide semiconductor field effect transistor (MOSFET). In an embodiment, the detection transistor DT may be a P-channel metal oxide semiconductor (PMOS) transistor. Meanwhile, it should be understood that embodiments of the detection transistor DT are not limited thereto.

The monitoring unit 131 may be connected to the detection circuit 121. The monitoring unit 131 may include monitoring transistors MT1 and MT2 and monitoring resistors MR1 and MR2. Meanwhile, it should be understood that the number of monitoring transistors, the number of monitoring resistors, and combinations thereof, according to various embodiments of the inventive concept, are not limited thereto.

The first monitoring transistor MT1 may be connected between the third node ND3 and the first monitoring resistor MR1. The first monitoring transistor MT1 has a gate connected to an activation node Nact of the monitoring circuit 130 (refer to FIG. 1). The first monitoring resistor MR1 may be connected between a drain of the first monitoring transistor MT1 and a ground terminal GND.

The second monitoring transistor MT2 may be connected between a drain of the detection transistor DT and a monitoring node Nmntr of the monitoring circuit 130. The second monitoring transistor MT2 has a gate connected to the activation node Nact of the monitoring circuit 130. The second monitoring resistor MR2 may be connected between the monitoring node Nmntr and the ground terminal GND.

Meanwhile, FIG. 3 illustrates only one detection circuit 121 connected between the pad 101 and the second node ND2 and one monitoring unit 131 related thereto for convenience of explanation. The current detection device 102 according to embodiments of the present inventive concept may be implemented by connecting a plurality of detection circuits (refer to FIGS. 1, 121 to 12$k$) between the pad 101 and the second node ND2 with the plurality of monitoring units 131 to 13$k$ corresponding to the plurality of detection circuits 121 to 12$k$. Here, each of the plurality of detection circuits 121 to 12$k$ has different detection transistor characteristics.

Figure 4A:
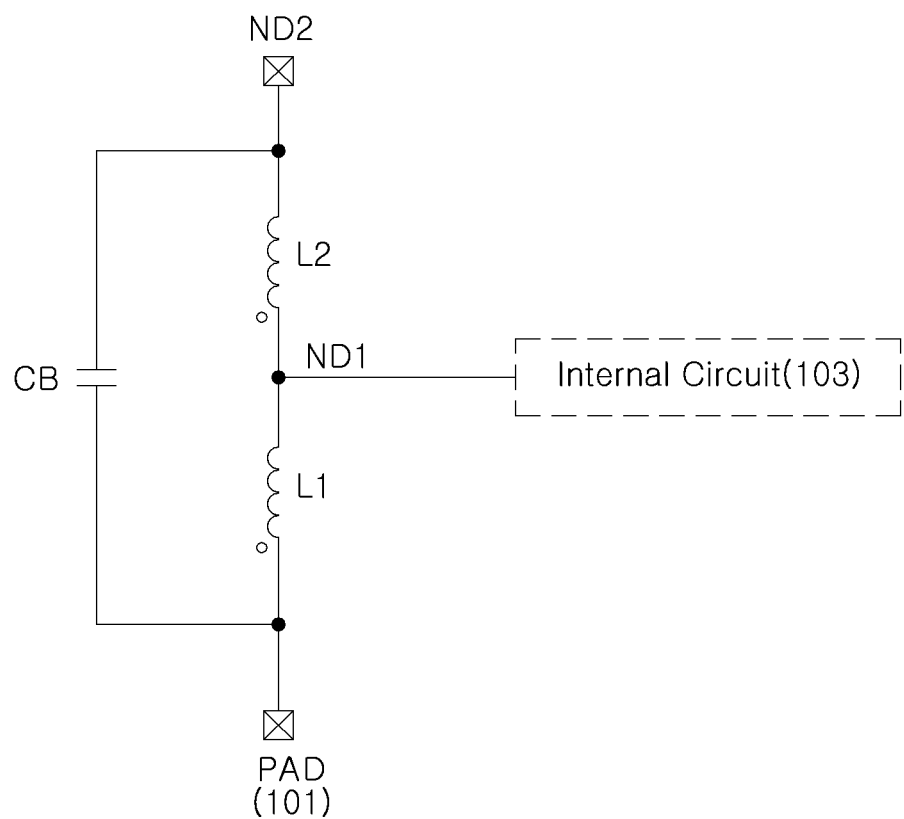
FIG. 4A is a view illustrating a T-coil according to an embodiment of the present inventive concept.

FIG. 4A is a view illustrating the T-coil 111 according to an embodiment of the present inventive concept. Referring to FIG. 4A, the detection transistor DT may be implemented as a device that may be implemented in a semiconductor, such as a MOSFET, a BJT, a FinFET, or a capacitor.

By connecting the current sensing circuit 110 (refer to FIG. 1) to at least two nodes of the detection transistor DT, a coupled induced voltage from the current sensing circuit 110 may be applied to the detection circuit 121 (refer to FIG. 3). In this case, noise filtering and DC coupling may be provided by disposing a diode, resistor, reactor, or capacitor between the nodes of the detection transistor DT or between the detection transistor DT and the current sensing circuit 110.

In an embodiment, the induced voltage may be a voltage induced to at least two nodes of the T-coil 111.

Figure 4B:
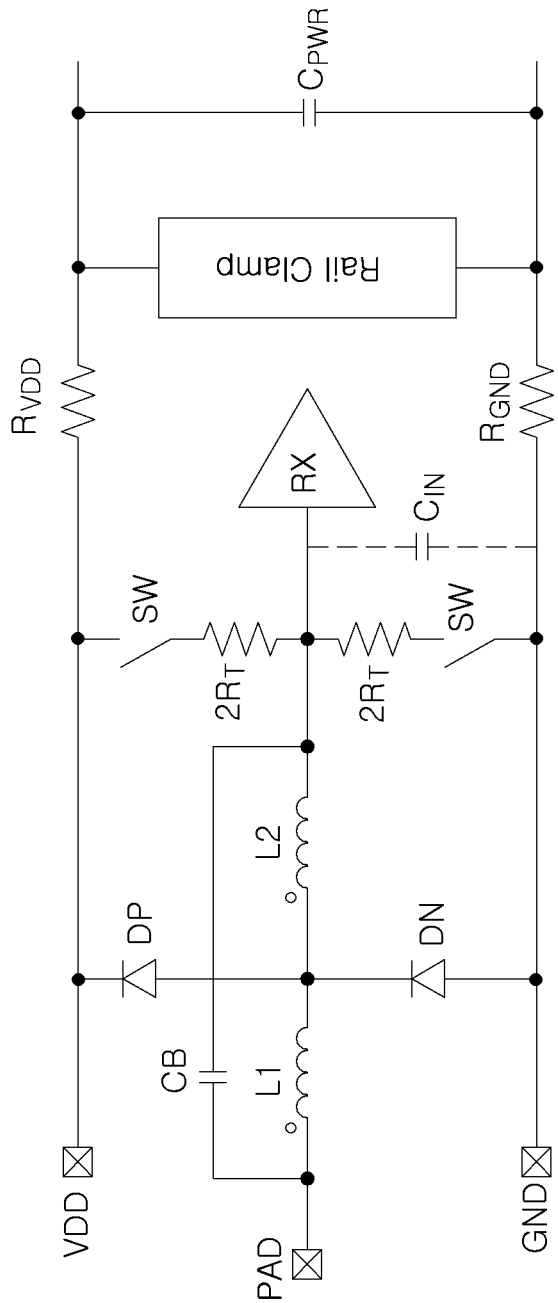
FIG. 4B is a diagram illustrating a T-coil according to another embodiment of the present inventive concept.

Meanwhile, in FIGS. 3 and 4B, the internal circuit 103 is connected to the first node ND1 of the T-coil 111. However, the internal circuit 103 is not limited to being connected to the first node ND1 of the T-coil 111 according to various embodiments. A node to which the internal circuit 103 and the pad 101 are not connected may be connected to an ESD protection circuit or termination.

FIG. 4B is a diagram illustrating a T-coil according to another embodiment of the present inventive concept. Referring to FIG. 4B, the T-coil may be connected to the ESD protection circuit. The ESD protection circuit includes diodes DN and DP, resistors 2RT, $R_{VDD}$, and $R_{GND}$, switches SW, a rail clamping circuit, and capacitors $C_{IN}$ and $C_{PWR}$ between the power supply terminal VDD and the ground terminal GND.

Figure 5:
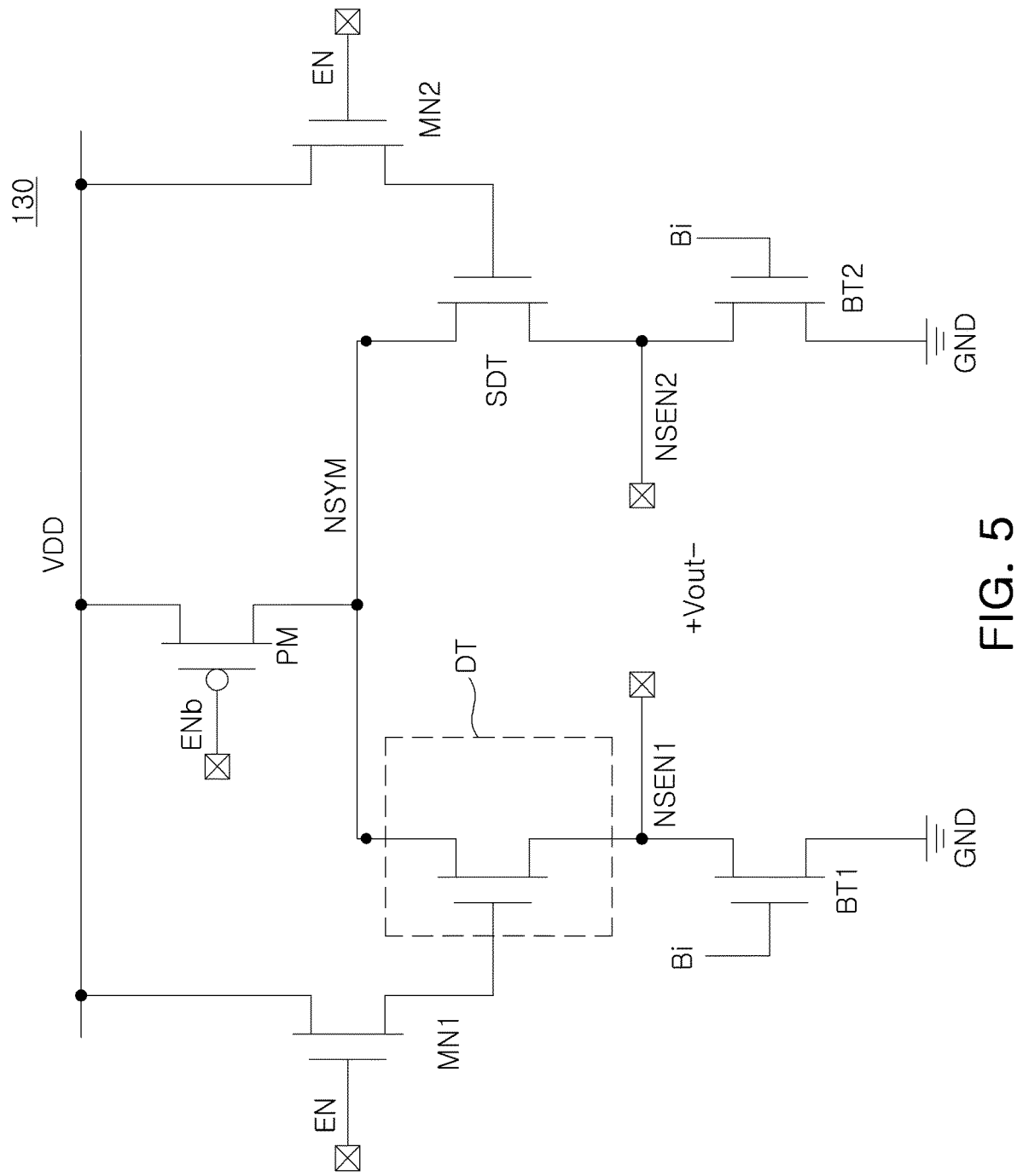
FIG. 5 is a diagram illustrating a monitoring circuit according to an embodiment of the present inventive concept.

FIG. 5 is a diagram illustrating the monitoring circuit 130 according to an embodiment of the present inventive concept. The monitoring circuit 130 may be implemented to check a change in a characteristic of the detection transistor DT due to an ESD event. As illustrated in FIG. 5, the monitoring circuit 130 may be implemented so that the detection transistor DT and a circuit having an output net resulting therefrom are bilaterally symmetrical.

The monitoring circuit 130 includes a PMOS transistor PM, first and second NMOS transistors NM1 and NM2, first and second bias transistors BT1 and BT2, and a symmetric detection transistor SDT.

The PMOS transistor PM is connected between the power supply terminal VDD and a symmetric node NSYM, and has a gate configured to receive an inverted signal ENb of a monitoring enable signal EN. The first NMOS transistor NM1 is connected between the power supply terminal VDD and the detection transistor DT, and has a gate configured to receive the monitoring enable signal EN. The second NMOS transistor NM2 is connected between the power supply terminal VDD and the symmetric detection transistor SDT, and has a gate configured to receive the monitoring enable signal EN.

The first bias transistor BT1 is connected between a first sensing node NSEN1 and the ground terminal GND and has a gate configured to receive a bias signal Bi. The second bias transistor BT2 is connected between a second sensing node NSEN2 and the ground terminal GND and has a gate configured to receive the bias signal Bi. Here, a voltage difference Vout between the first sensing node NSEN1 and the second sensing node NSEN2 may be used as a detection signal indicating whether an ESD event is detected.

The symmetric detection transistor SDT is connected between the symmetric node NSYM and the second sensing node NSEN2, and has a gate that may be connected to a source of the second NMOS transistor MN2.

The detection transistor DT is connected between the symmetric node NSYM and the first sensing node NSEN1, and has a gate that may be connected to a source of the first NMOS transistor MN1.

Referring back to FIG. 5, in the monitoring circuit 130, the Vout difference may be very small due to the symmetrical circuit characteristics before the change in the characteristic of the monitoring detection transistor DT. Meanwhile, in the monitoring circuit 130, when the characteristic of the detection transistor DT is changed based on an ESD event, the voltage difference Vout may increase. The monitoring circuit 130 may be configured to determine whether there is a change in the characteristics of the detection transistor DT and the extent of the change by using the Vout voltage difference.

Figure 6A:
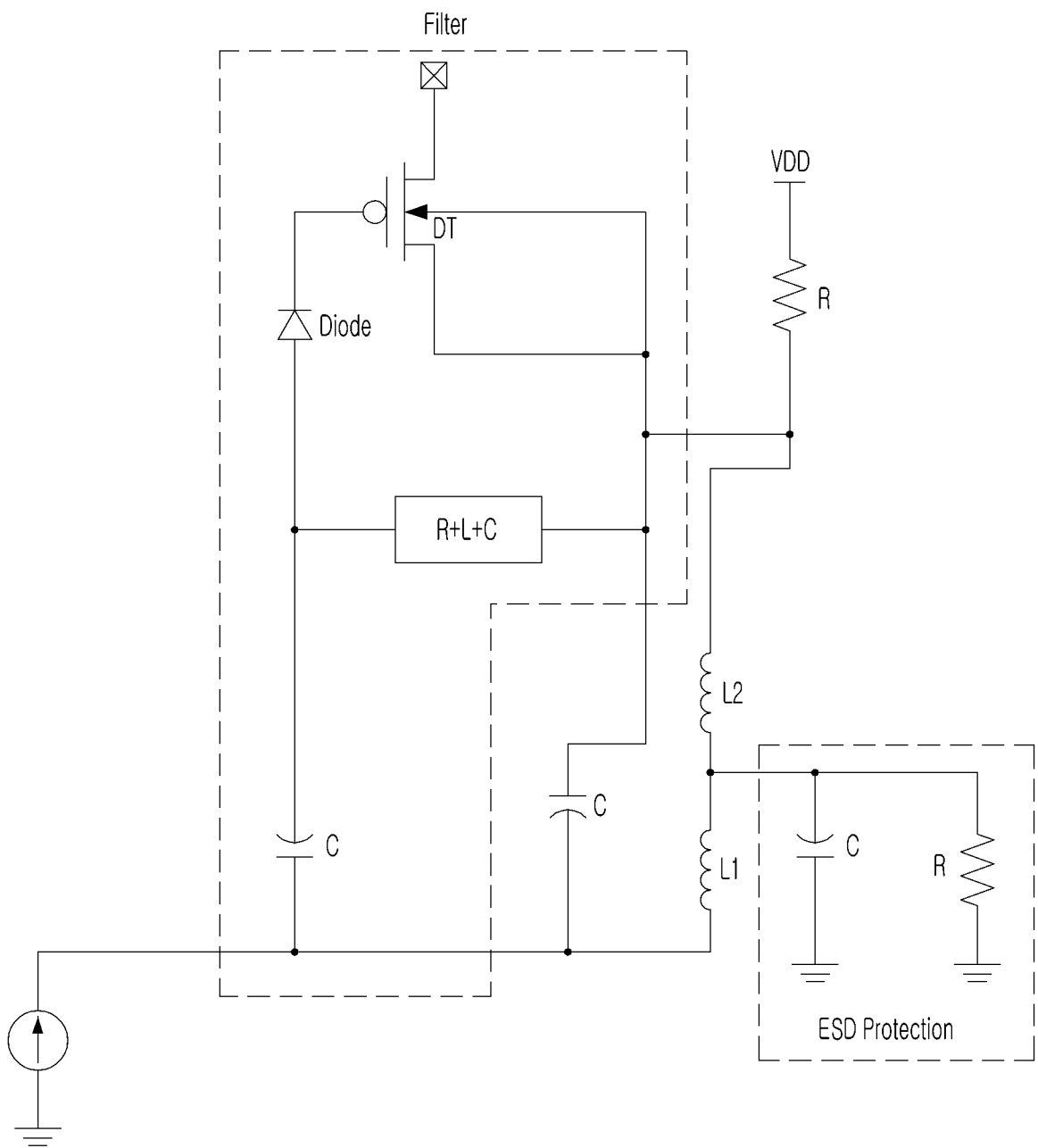
FIGS. 6A and 6B are diagrams illustrating a sensing level adjustment according to a structure of a filter in a current detection device according to an embodiment of the present inventive concept.
Figure 6B:
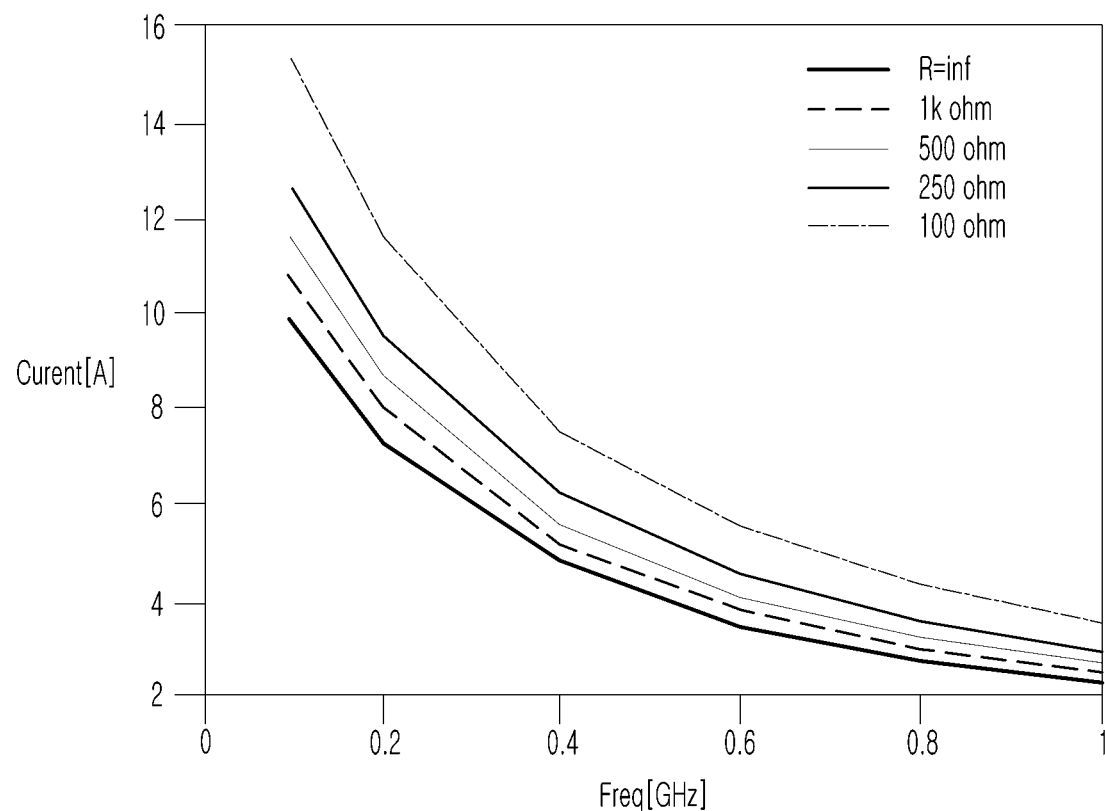

FIGS. 6A and 6B are diagrams illustrating a sensing level adjustment based on a structure of a filter in the current detection device 102 according to an embodiment of the present inventive concept. As illustrated in FIG. 6A, the sensitivity of coupling may be adjusted by connecting the resistor R, the reactor L, and the capacitor C in parallel with the detection transistor. As illustrated in FIG. 6B, a current range through a parallel connection of the monitoring circuit may be predicted for each sensitivity.

Meanwhile, detection circuits may be configured according to such sensitivity.

Figure 7:
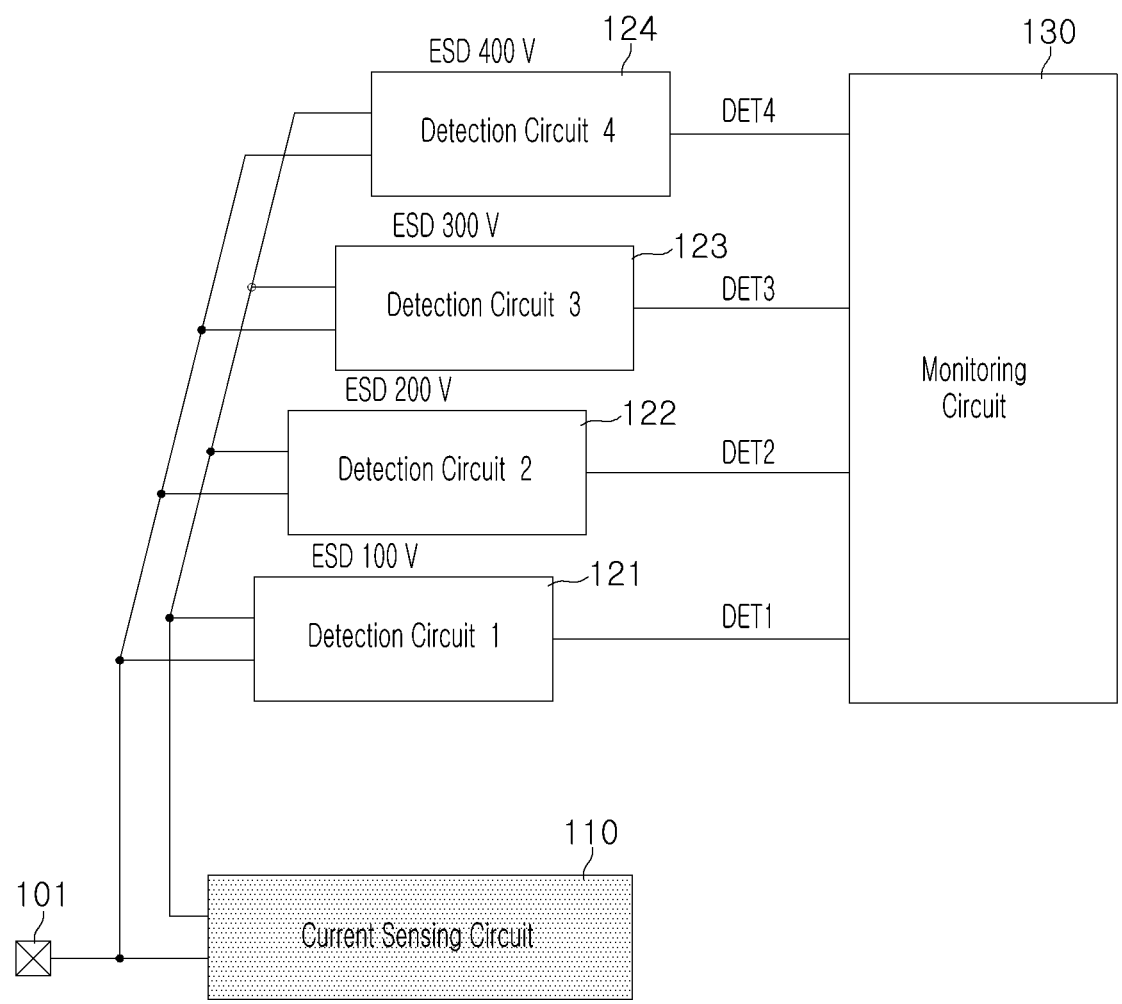
FIG. 7 is a diagram illustrating a current detection device that is configured to detect different ESD events according to an embodiment of the present inventive concept.

FIG. 7 is a diagram illustrating the current detection device 102 that is configured to detect different ESD events according to an embodiment of the present inventive concept. Referring to FIG. 7, the current detection device 102 may include four detection circuits 121, 122, 123, and 124 based on an induced voltage of the ESD event.

The first detection circuit 121 may be configured to detect an induced voltage less than 100V according to an ESD event and output a first detection signal DET1. The second detection circuit 122 may detect an induced voltage of 100 V or more and 200 V or less according to an ESD event, and may output a second detection signal DET2. The third detection circuit 123 may detect an induced voltage of 200V or more and 300V or less according to an ESD event, and may output a third detection signal DET3. The fourth detection circuit 124 may detect an induced voltage of 300V or more and 400V or less according to an ESD event, and may output a fourth detection signal DET4.

As described above, each of the detection circuits 121, 122, 123, and 124 may be implemented to have different coupling sensitivities.

Figure 8A:
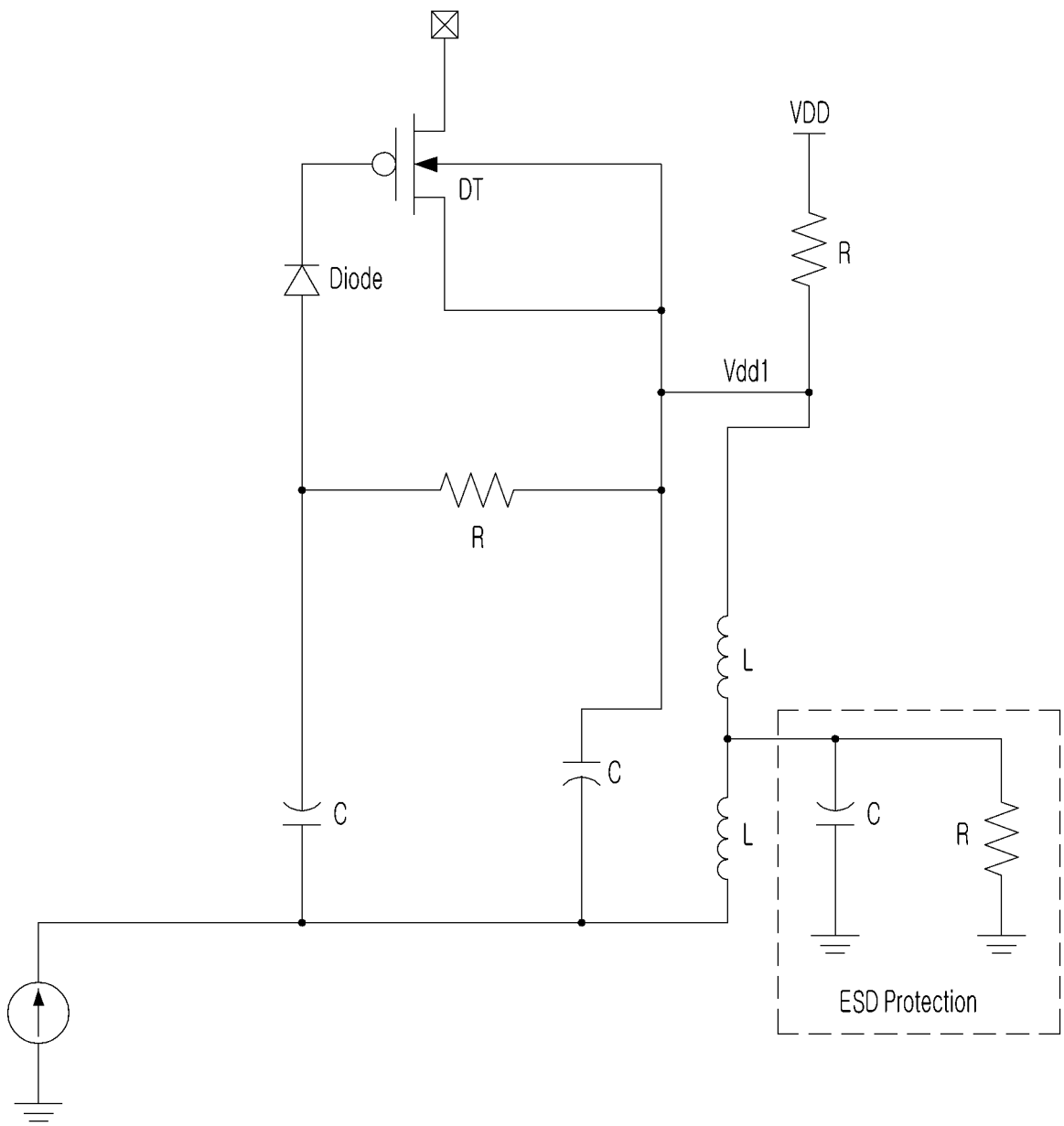
FIGS. 8A and 8B are diagrams illustrating ESD polarity detection of a current detection device according to an embodiment of the present inventive concept.
Figure 8B:
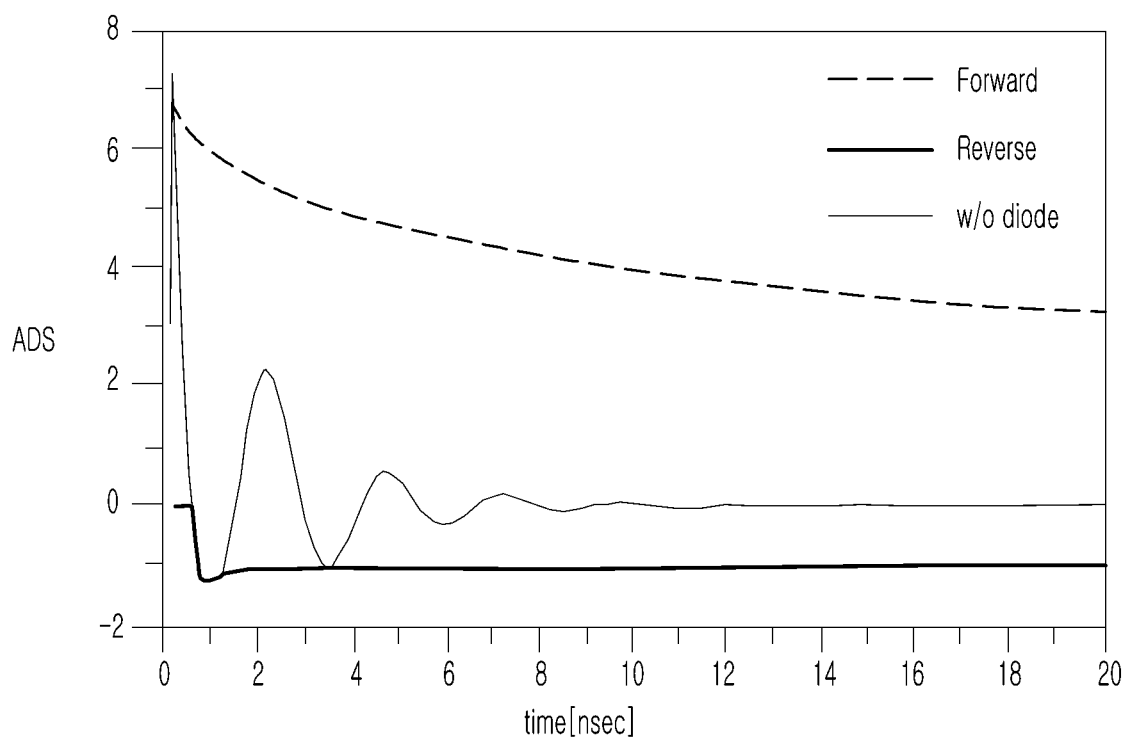

FIGS. 8A and 8B are diagrams illustrating ESD polarity detection of the current detection device 102 according to an embodiment of the present inventive concept. As illustrated in FIG. 8A, the current detection device 102 may be implemented to be coupled to the detection transistor DT to detect only ESD events of a specific polarity by placing a diode in a coupling path. As illustrated in FIG. 8B, the current detection device 102 may be configured to estimate a polarity of a temporary event by examining voltage stress according to a diode installation direction over time.

Figure 9:
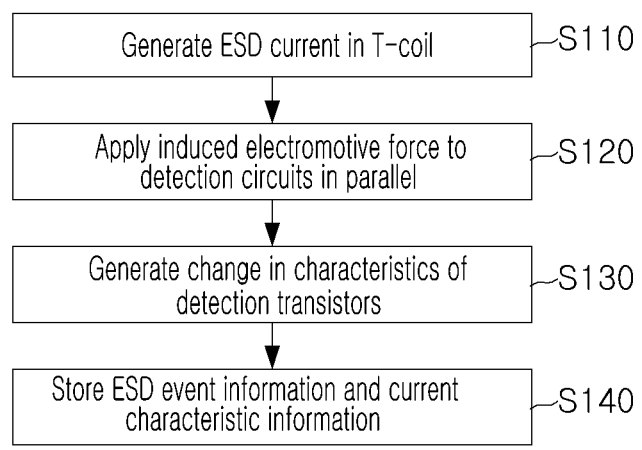
FIG. 9 is a flowchart illustrating an operating method of an integrated circuit according to an embodiment of the present inventive concept.

FIG. 9 is a flowchart illustrating an operating method of an IC according to an embodiment of the present inventive concept.

Referring to FIGS. 1 to 9, an ESD detection operation of the IC 10, according to some embodiments, may be performed as follows: When an ESD event occurs in the T-coil 111 (refer to FIG. 3) of the IC 10, an ESD current may be generated (S110). Induced electromotive force (or an induced voltage) based on the ESD current flowing through the T-coil 111 may be generated. The induced electromotive force may be applied to the plurality of detection circuits 121 to 12k (refer to FIG. 1) having different sensitivities (S120). Each of the detection circuits 121 to 12k may cause a change in a characteristic of the detection transistor DT responsive to the applied induced electromotive force (S130). The monitoring circuit 130 of the current detection device 102 (refer to FIG. 1) may monitor characteristics of each of the detection transistors DT of the detection circuits 121 to 12k. The monitored ESD event information and current characteristic information may be stored in the internal circuit 103 of the IC 100 (S140).

In an embodiment, the plurality of detection circuits may have different ESD sensitivities by connecting a resistor, a reactor, a capacitor, and/or a diode to the detection transistor. In an embodiment, a change in the characteristic of the detection transistor of each of the plurality of detection circuits may be monitored. In an embodiment, the presence or absence of damage to the detection transistor may be determined by checking an output node voltage corresponding to the detection transistor in order to indicate ESD event information. In an embodiment, a polarity of the ESD current may be estimated according to the change in the characteristic of the detection transistor.

In the IC according to an embodiment of the present inventive concept, a detection circuit and a monitoring circuit may be added to an I/O terminal including a T-coil so that ESD events occurring during the IC PKG (package)-PCB (Printed Circuit Board)-SET (assembly) process may be monitored. Accordingly, the IC according to an embodiment of the present inventive concept may provide information for managing ESD risk in the process. The IC according to an embodiment of the present inventive concept may enable identification of a log of a defect occurring due to transportation, PCB assembly, and a transient event during use after the IC PKG manufacturing process. In addition, by specifying an approximate level, frequency, etc. of a transient event occurring during manufacturing or in the field, event occurrence information and current characteristic information stored in the ESD protection device design may be used as a reference.

Meanwhile, the IC according to an embodiment of the present inventive concept may include a register for storing ESD event information.

Figure 10:
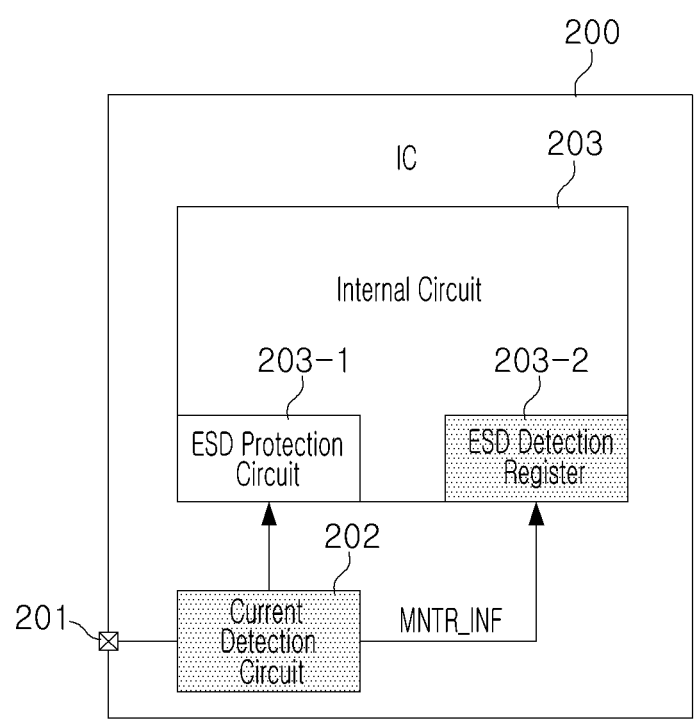
FIG. 10 is a diagram illustrating an integrated circuit according to another embodiment of the present inventive concept.

FIG. 10 is a diagram illustrating an IC 200 according to another embodiment of the present inventive concept.

Referring to FIG. 10, the IC 200 may include a current detection device 202 and an internal circuit 203. The current detection device 202 may be configured to generate induced electromotive force when an ESD event occurs, and may be configured to generate detection signals based on the induced electromotive force generated from a plurality of detection circuits having different sensitivities, as described above with reference to FIGS. 1 to 9. The internal circuit 203 may include an ESD protection circuit 203-1 and an ESD detection register 203-2. The ESD protection circuit 203-1 may be implemented to protect the internal circuit 203 from an ESD event. The ESD detection register 203-2 may be implemented to store monitoring information MNTR_INF corresponding to the detection signals. In an embodiment, the ESD detection register 203-2 may be implemented as a non-volatile memory.

Meanwhile, the current detection device according to an embodiment of the present inventive concept is applicable to a storage device.

Figure 11:
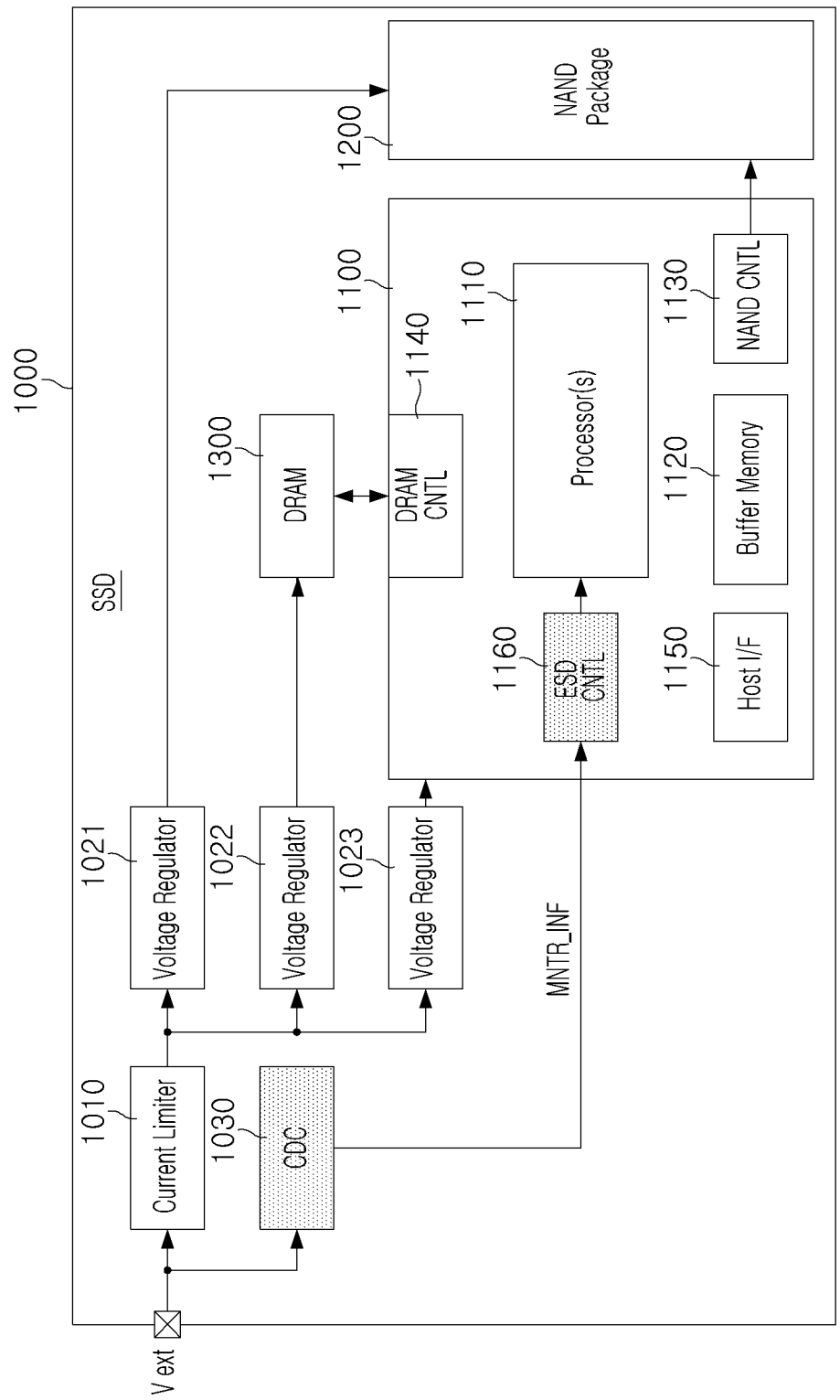
FIG. 11 is a diagram illustrating a storage device according to an embodiment of the present inventive concept.

FIG. 11 is a diagram illustrating a storage device according to an embodiment of the present inventive concept. Referring to FIG. 11, the storage device 1000 may include a current limiter 1010, voltage regulators 1021, 1022, and 1023, a current detection device 1030 (CDC), a controller 1100, a NAND package 1200, a volatile memory device (DRAM) 1300.

The current limiter 1010 may be implemented to receive an external voltage Vext from a host device and limit an input current.

Each of the voltage regulators 1021, 1022, and 1023 may be implemented to generate voltages for the corresponding internal devices 1100, 1200, and 1300 and provide the generated voltages.

As described above in FIGS. 1 to 10, the current detection device (CDC) 1030 may be implemented to generate induced electromotive force when an ESD event occurs, to generate detection signals having different sensitivities based on the induced electromotive force, and to generate monitoring information MNTR_INF including the detection signals.

The controller 1100 may be implemented to control an overall operation of the storage device 1000. The controller 1100 may include at least one processor (central processing unit(s); 1110), a buffer memory 1220, a NAND flash memory controller 1130, a volatile memory controller 1140, a host interface (I/F) circuit 1150, and an ESD controller 1160.

At least one processor 1110 may be implemented to control the overall operation of the controller 1100. The processor 1110 may be implemented to drive a direct memory access (DMA) engine. Here, the DMA engine is configured to control a DMA operation of the storage device 1000. The DMA engine may be configured to perform data transmission with a host device or another external device under the control of the processor 1110. For example, the DMA engine may be configured to transmit read data loaded into the volatile memory device 1300 in the form of a stream to the host device in a DMA transfer mode. In other embodiments, the DMA engine may be configured to store stream data provided from the host device in the volatile memory device 1300 in the DMA transfer mode. In some embodiments, the DMA engine may be configured to perform a DMA operation between the host device and the volatile memory device 1300.

The buffer memory 1120 may be implemented to temporarily store data for the operation of the controller 1100. The buffer memory 1220 may be implemented as a volatile memory (e.g., static random access memory (SRAM), dynamic RAM (DRAM), synchronous RAM (SDRAM), etc.) and/or a non-volatile memory (flash memory, phase-change RAM (PRAM), magneto-resistive RAM (MRAM), resistive RAM (ReRAM), ferro-electric RAM (FRAM), etc.).

The NAND flash memory controller 1130 may be implemented to control the NAND package 1200. The NAND flash memory controller 1130 may be configured to perform various management operations, such as cache/buffer management, firmware management, garbage collection management, wear leveling management, data deduplication management, read refresh/reclaim management, bad block management, multi-stream management, mapping management of host data and non-volatile memory, quality of service (QoS) management, system resource allocation management, non-volatile memory queue management, read level management, erase/program management, hot/cold data management, power loss protection management, dynamic thermal management, initialization management, and redundant array of inexpensive disk (RAID) management.

The NAND flash memory controller 1130 may be configured to transmit a command and an address to perform a program operation, a read operation, an erase operation, etc. on the NAND flash memory device of the NAND package 1200. The NAND flash memory controller 1130 may be connected to the NAND package 1200 through a plurality of control pins transmitting control signals (e.g., CLE, ALE, CE(s), WE, RE, etc.). Also, the NAND flash memory controller 1130 may be implemented to control the NAND package 1200 using control signals (CLE, ALE, CE(s), WE, RE, etc.). For example, a NAND flash memory device may be configured to perform a program operation/read operation/erase operation by latching a command or an address at an edge of a write enable (WE)/read enable (RE) signal based on a command latch enable (CLE) signal and an address latch enable (ALE) signal. For example, during a read operation, the chip enable signal CE may be enabled, CLE may be enabled during a command transmission interval, ALE may be enabled during an address transmission interval, and RE may be toggled at an interval during which data is transmitted through a data signal line DQ. A data strobe signal DQS may be toggled with a frequency corresponding to the data I/O speed. The read data may be sequentially transmitted in synchronization with the data strobe signal DQS.

In an embodiment, the NAND flash memory controller 1130 may be implemented to comply with a standard, such as Joint Electron Device Engineering Council (JDEC) Toggle or Open NAND Flash Interface (ONFI).

Also, the NAND flash memory controller 1130 may include an error correction code (ECC) circuit. The ECC circuit may be configured to generate an error correction code for correcting a fail bit or an error bit of data received from the NAND package 1200. The ECC circuit may form data to which a parity bit is added by performing error correction encoding of data provided to the NAND package 1200. The parity bit may be stored in the NAND package 1200. Also, the ECC circuit may be configured to perform error correction decoding on data output from the NAND package 1200. The ECC circuit may be configured to use parity to correct errors. The ECC circuit may be configured to correct errors by using coded modulation, such as low density parity check (LDPC) code, BCH code, Turbo code, Reed-Solomon code, Convolution code, Recursive Systematic Code (RSC), Trellis-Coded Modulation (TCM), binary code modulation (BCM). Meanwhile, when the ECC circuit is unable to correct an error, a read retry operation may be performed.

Also, the NAND flash memory controller 1130 may include a flash translation layer manager. The flash translation layer manager may be configured to perform various functions, such as address mapping, wear-leveling, and garbage collection.

Also, the NAND flash memory controller 1130 may include a security module. The security module may be configured to perform an encryption operation and/or a decryption operation on data input to the processor 1110 using a symmetric-key algorithm. The security module may include an encryption module and a decryption module. In an embodiment, the security module may be implemented in hardware/software/firmware. The security module may be implemented to perform a security function of the storage device 1000. For example, the security module may be configured to perform a self-encryption disk (SED) function or a trusted computing group (TCG) security function.

The SED function may store encrypted data in the non-volatile memory device 1200 using an encryption algorithm or may decrypt encrypted data from the non-volatile memory device 1200. This encryption/decryption operation may be performed using an internally generated encryption key. In an embodiment, the encryption algorithm may be an advanced encryption standard (AES) encryption algorithm. Meanwhile, it should be understood that embodiments of the encryption algorithm are not limited thereto. The TCG security function may provide a mechanism enabling access control to user data of the storage device 1000. For example, the TCG security function may be configured to perform an authentication procedure between an external device and the storage device 1000. In an embodiment, the SED function or the TCG security function may be selectable. In addition, the security module may be implemented to perform an authentication operation with an external device or to perform a fully homogeneous encryption function.

The volatile memory controller 1140 may be implemented to control the volatile memory device 1300. The volatile memory controller 1140 may write data to the volatile memory device 1300 or read data stored in the volatile memory device 1300 under the control of the processor 1110. Here, the volatile memory controller 1140 may include a buffer allocation unit configured to manage the volatile memory device 1300 as a buffer. The buffer allocation unit may manage use and release of the volatile memory device 1300.

The host interface circuit 1150 may be implemented to communicate with a host device. The host interface circuit 1150 may be implemented to transmit and receive packets to and from the host device. A packet transmitted from the host device to the host interface 1150 may include a command or data to be written to the NAND package 1200. A packet transmitted from the host interface circuit 1150 to the host device may include a response to a command or data read from the NAND package 1200.

In an embodiment, the host interface circuit 1150 may be compatible with one or more of a peripheral component interconnect express (PCIe) interface standard, a universal serial bus (USB) interface standard, a compact flash (CF) interface standard, a multi-media card (MMC) interface standard, an embedded MMC (eMMC) interface standard, a thunderbolt interface standard, a universal flash storage (UFS) interface standard, a secure digital (SD) interface standard, a memory stick interface standard, an extreme digital (xD)-picture card interface standard, integrated drive electronics (IDE) interface, a serial advanced technology attachment (SATA) interface standard, a small computer system interface (SCSI) interface standard, a serial attached SCSI (SAS) interface standard, and an enhanced small disk interface (ESDI).

The ESD controller 1160 may be implemented to control an internal operation of the storage device 1000 according to the monitoring information MNTR_INF. The ESD controller 1160 may further include a storage space for storing the monitoring information MNTR_INF.

The NAND package 1200 may include at least one NAND flash memory device. Here, the NAND flash memory device may be implemented as a three-dimensional array structure. For example, the NAND flash memory device may be implemented as a vertical NAND flash memory device. The NAND package 1200 may be connected to the NAND flash memory controller 1130 through at least one channel. Here, a plurality of NAND flash memory devices may be connected to at least one channel. Each of the NAND flash memory devices may include a plurality of memory cells connected to word lines and bit lines. Here, each of the plurality of memory cells may be implemented to store at least one bit.

The volatile memory device 1300 may be used as a data buffer for data exchange between the storage device 1000 and the host device. Also, the volatile memory device 1300 may store a mapping table for mapping a logical address provided to the storage device 1000 and an address of the NAND package 1200. The mapping table may be loaded into the volatile memory device 1300 from the NAND package 1200 during an initialization operation of the storage device 1000. The volatile memory device 1300 may temporarily store write data provided from the host device or data read from the NAND package 1200. When data present in the NAND package 1200 is cached upon a read request from the host device, the volatile memory device 1300 may support a cache function of directly providing the cached data to the host device. In an embodiment, the volatile memory device 1300 may be implemented as a dynamic random access memory (DRAM) to provide sufficient buffering in the storage device 1000.

Figure 12A:
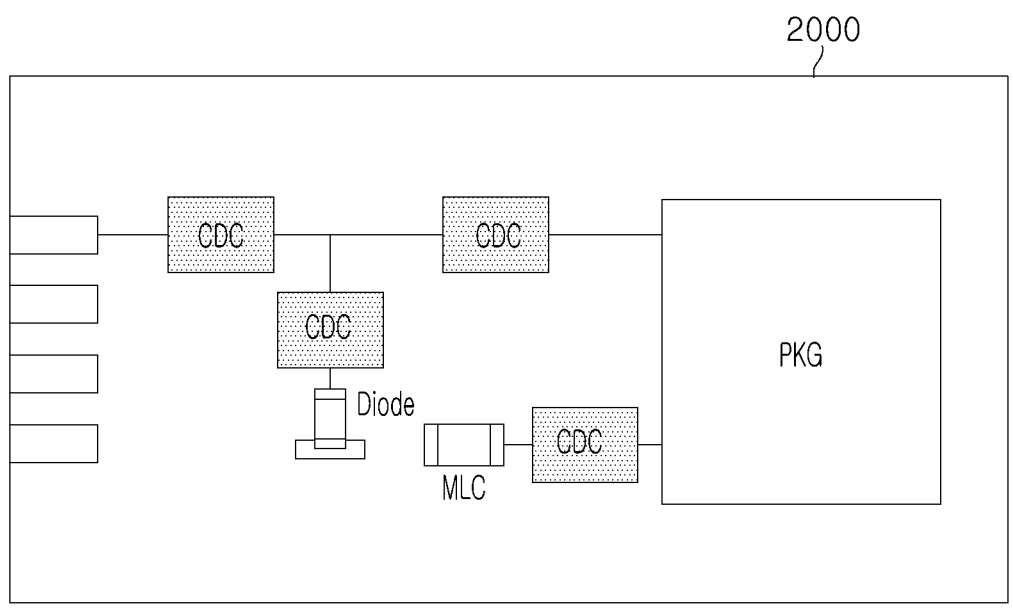
FIGS. 12A and 12B are diagrams illustrating an arrangement of a current detection device CDC according to an embodiment of the present inventive concept.
Figure 12B:
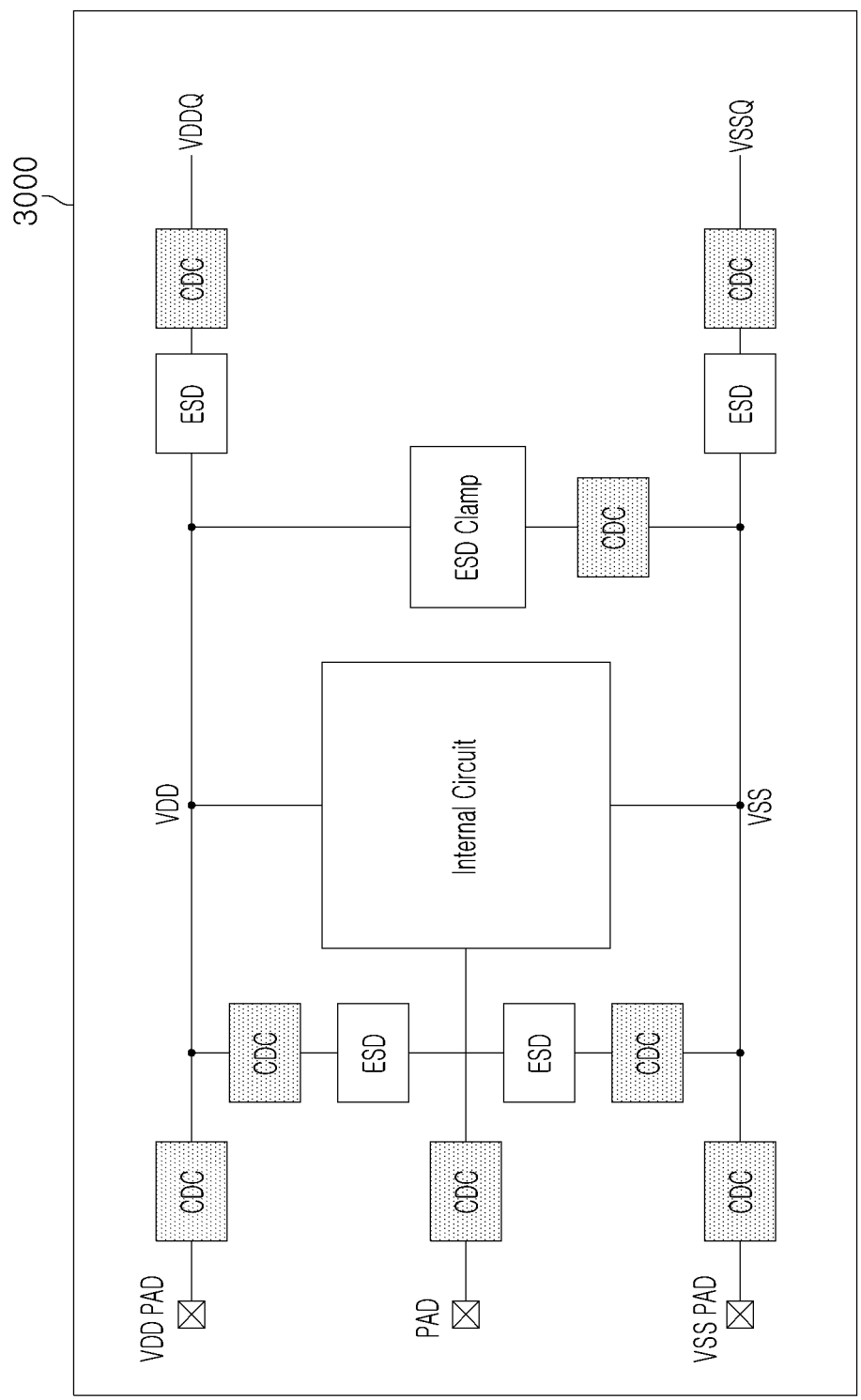

FIGS. 12A and 12B are diagrams illustrating an arrangement of a current detection device CDC according to an embodiment of the present inventive concept.

As illustrated in FIG. 12A, the current detection device CDC may be disposed on all ball pads when disposed in a package. A semiconductor device 2000 may be a system including a printed circuit board and a plurality of semiconductor packages mounted thereon. When an overcurrent flows into a plurality of wiring pads due to a transition event, such as a voltage/current surge or static electricity, an induced voltage may be applied by the T-coil. The induced voltage and/or a resultant induced current may damage a gate insulating layer of the detection transistor or the like. Due to this, the characteristic of the detection transistor may be changed. When the semiconductor device receives power and starts an operation, a controller may monitor a detection signal corresponding to the change in the characteristic of the detection transistor element using the current detection device CDC, and store monitoring information. The corresponding controller may determine whether an event causing the overcurrent has occurred, or the intensity of the event.

Referring to FIG. 12B, the current detection device CDC may be disposed at all positions through which an ESD current flows, such as all pads and the ESD protection circuit. A semiconductor device 3000 of the present inventive concept may include a plurality of pads, an internal circuit, and an ESD protection circuit. The plurality of pads may include power pads configured to receive the power supply voltages VDD, VSS, VDDQ, and VSSQ and a signal pad receiving the data signal DQ. For example, the semiconductor device may receive first and second power supply voltages VDD and VSS necessary for the operation of the internal circuit through the first and second power supply pads VDD and VSS, and may receive third and third power supply voltages VDDQ and VS SQ necessary for data I/O through third and fourth power supply pads VDD and VSS.

The ESD protection circuit may include a plurality of ESD elements and an ESD clamp circuit. The plurality of ESD elements may include elements, such as diodes. In at least one of the paths connecting the plurality of pads and the internal circuit, a T-coil may be disposed through which an overcurrent input to the plurality of pads due to a transition event flows. To prevent overcurrent flowing into the T-coil from flowing into the internal circuit, the T-coil may be connected to at least one of the ESD protection circuits. The semiconductor device may be one IC chip. Here, a plurality of candidate positions to which the T-coil may be connected may exist in the IC chip. For example, the T-coil may be disposed on a semiconductor substrate in an IC chip. The T-coil may be provided by at least some of wiring patterns connected to elements formed on the semiconductor substrate.

The IC and the operating method thereof according to an embodiment of the present inventive concept may use a T-coil structure to generate a transistor inductive coupling voltage and sense a characteristic when a transient current occurs.

In the IC and the operating method thereof according to an embodiment of the present inventive concept, it may be possible to adjust a detection level according to a frequency of a transient current through filtering according to a coupled voltage frequency by adjusting the R-L-C characteristics connected to the monitoring transistor.

In an embodiment, it may be possible to perform detection according to a phase of a coupled voltage using a diode. In an embodiment, information estimating a detection range of a transient event may be provided by using a plurality of filtering combinations.

The IC and the operating method thereof according to an embodiment of the present inventive concept may be configured to generate an ESD current using a T-coil, and detect and store an ESD level using a plurality of detection circuits having different ESD sensitivities.

The IC and the operating method thereof according to an embodiment of the present inventive concept may be configured to determine whether ESD has occurred and an ESD level.

While example embodiments have been illustrated and described above, it will be apparent to those skilled in the art that modifications and variations could be made without departing from the scope of the present inventive concept as defined by the appended claims.

What is claimed is:

1. An integrated circuit comprising:
   a pad;
   a current detection device connected to the pad and configured to generate monitoring information corresponding to an electrostatic discharge (ESD) event; and
   an internal circuit configured to receive the monitoring information from the current detection device,
   wherein the current detection device includes:
   a current sensing circuit including a T-coil that is configured to generate an ESD current when the ESD event occurs, and is further configured to generate an induced voltage corresponding to the ESD current;
   a plurality of detection circuits configured to output a detection signal based on the induced voltage; and
   a monitoring circuit configured to receive the detection signal from each of the plurality of detection circuits and to generate the monitoring information,
   wherein the plurality of detection circuits have different sensitivities with respect to the induced voltage.

2. The integrated circuit of claim 1, wherein the induced voltage is a voltage induced to at least two nodes of the T-coil.

3. The integrated circuit of claim 1, wherein
   the current sensing circuit includes:
   a first reactor connected between the pad and a first node;
   a second reactor connected between the first node and a second node;
   a capacitor connected between the pad and the second node; and
   a resistor connected between a power supply terminal and the second node,
   wherein each of the plurality of detection circuits is connected between the pad and the second node, and
   wherein the internal circuit is connected to the first node or the second node.

4. The integrated circuit of claim 1, wherein
   each of the plurality of detection circuits includes:
   a detection transistor configured to output the detection signal including information on a polarity of the ESD current or a level of the ESD current; and
   at least one passive element connected to the detection transistor and configured to cause a change in an electrical characteristic of the detection transistor based on the induced voltage.

5. The integrated circuit of claim 4, wherein the at least one passive element includes a resistor, a reactor, a capacitor, or a diode.

6. The integrated circuit of claim 4, wherein the at least one passive element is connected in parallel or in series with the detection transistor so that a sensitivity of the detection transistor is adjusted.

7. The integrated circuit of claim 4, wherein the at least one passive element includes a diode disposed in a coupling path corresponding to the induced voltage.

8. The integrated circuit of claim 1, wherein the monitoring circuit includes a plurality of monitoring units configured to receive the detection signals from the plurality of detection circuits, respectively.

9. The integrated circuit of claim 8, wherein each of the plurality of monitoring units is configured to monitor a change in a characteristic of each of the plurality of detection circuits based on the detection signal.

10. The integrated circuit of claim 8, wherein
each of the plurality of detection circuits includes a detection transistor,
wherein each of the plurality of monitoring units includes:
a symmetric detection transistor connected to a symmetric node;
a PMOS transistor connected to a power supply terminal and the symmetric node, the PMOS transistor having a gate configured to receive an inverted signal of a monitoring enable signal;
a first NMOS transistor connected to the power supply terminal and a gate of the detection transistor, the first NMOS transistor having a gate configured to receive the monitoring enable signal;
a second NMOS transistor connected to the power supply terminal and a gate of the symmetric detection transistor, the second NMOS transistor having a gate configured to receive the monitoring enable signal;
a first bias transistor connected between a ground terminal and a first monitoring sensing node connected to a source of the detection transistor, the first bias transistor having a gate configured to receive a bias signal; and
a second bias transistor connected between the ground terminal and a second monitoring sensing node connected to a source of the symmetric detection transistor, the second bias transistor having a gate configured to receive the bias signal,
wherein an output voltage between the first monitoring sensing node and the second monitoring sensing node is the detection signal.

11. An integrated circuit comprising:
an internal circuit; and
at least one current detection device connected to the internal circuit, and configured to generate an electrostatic discharge (ESD) current using a T-coil when an ESD event occurs, to detect an ESD level based on the ESD current using a plurality of detection circuits, and to generate ESD monitoring information based on the ESD level,
wherein the internal circuit includes:
at least one ESD protection circuit configured to protect the internal circuit from the ESD event; and
an ESD detection register configured to store the ESD monitoring information.

12. The integrated circuit of claim 11, wherein
the at least one ESD protection circuit is disposed on a power line or an input/output (I/O) line,
wherein the at least one ESD protection circuit includes a capacitor and a resistor.

13. The integrated circuit of claim 11, wherein the plurality of detection circuits are connected to the T-coil in parallel and are configured to receive an induced voltage based on the ESD current.

14. The integrated circuit of claim 13, wherein the induced voltage is a voltage induced to at least two nodes of the T-coil.

15. The integrated circuit of claim 13, wherein
each of the plurality of detection circuits includes:
a detection transistor; and
at least one passive element connected to the detection transistor,
wherein a characteristic of the detection transistor is changed as an electrical characteristic value of the at least one passive element is changed based on the induced voltage.

16. An integrated circuit comprising:
a current sensing circuit configured to generate an electrostatic discharge (ESD) current using a T-coil when an ESD event occurs;
a plurality of detection circuits connected to the T-coil and configured to receive an induced voltage corresponding to the ESD current; and
a monitoring circuit configured to monitor a change in a characteristic of each of the plurality of detection circuits.

17. The integrated circuit of claim 16, further comprising:
a pad,
wherein the current sensing circuit is connected to the pad and further includes:
a first reactor connected between the pad and a first node;
a second reactor connected between the first node and a second node;
a capacitor connected between the pad and the second node; and
a resistor connected between a power supply terminal and the second node.

18. The integrated circuit of claim 17, wherein each of the plurality of detection circuits includes a detection transistor configured to change in a characteristic based on the induced voltage.

19. The integrated circuit of claim 17, wherein
each of the plurality of detection circuits includes a detection transistor and at least one passive element connected to the detection transistor,
wherein the at least one passive element includes:
a first passive element connected between a third node and a gate of the detection transistor;
a second passive element connected between the second node, a drain of the detection transistor, or the third node; or
a third passive element connected between the pad and the third node.

20. The integrated circuit of claim 19, wherein
the monitoring circuit includes:
a first monitoring transistor connected to the third node, the first monitoring transistor having a gate configured to receive a monitoring enable signal;
a second monitoring transistor connected to a source of the detection transistor and configured to receive the monitoring enable signal;
a first monitoring resistor connected between a source of the first monitoring transistor and a ground terminal; and a second monitoring resistor connected between a source of the second monitoring transistor, which is connected to a monitoring node, and the ground terminal.

* * * * *